(12) United States Patent
Dobler

(10) Patent No.: US 11,093,851 B2
(45) Date of Patent: Aug. 17, 2021

(54) METHOD, APPARATUS AND COMPUTER PROGRAM PRODUCT FOR DETERMINING FAILURE REGIONS OF AN ELECTRICAL DEVICE

(71) Applicant: Infineon Technologies AG, Neubiberg (DE)

(72) Inventor: Markus Dobler, Pfäffingen (DE)

(73) Assignee: Infineon Technologies AG, Neubiberg (DE)

( * ) Notice: Subject to any disclaimer, the term of this patent is extended or adjusted under 35 U.S.C. 154(b) by 1991 days.

(21) Appl. No.: 14/029,883

(22) Filed: Sep. 18, 2013

(65) Prior Publication Data
US 2015/0081599 A1    Mar. 19, 2015

(51) Int. Cl.
   *G06F 15/18*   (2006.01)
   *G06N 20/00*   (2019.01)
   *G01R 31/00*   (2006.01)
   *G01R 31/08*   (2020.01)

(52) U.S. Cl.
   CPC ............. *G06N 20/00* (2019.01); *G01R 31/00* (2013.01); *G01R 31/088* (2013.01)

(58) Field of Classification Search
   CPC ..... G06N 99/005; G01R 31/00; G01R 31/088
   USPC ........................................................ 706/12
   See application file for complete search history.

(56) References Cited

U.S. PATENT DOCUMENTS

| | | | | |
|---|---|---|---|---|
| 6,436,557 | B1 * | 8/2002 | Moriuchi | C08K 3/22 428/378 |
| 8,041,541 | B2 * | 10/2011 | Buxton et al. | 702/183 |
| 8,108,332 | B2 * | 1/2012 | Misra et al. | 706/52 |
| 2005/0017747 | A1 * | 1/2005 | Muller et al. | 324/765 |
| 2010/0063948 | A1 * | 3/2010 | Virkar | G06N 99/005 706/12 |
| 2010/0153086 | A1 * | 6/2010 | Satoh | G06F 17/5036 703/14 |
| 2013/0226544 | A1 * | 8/2013 | Mcconaghy | G06F 17/5022 703/2 |

OTHER PUBLICATIONS

"Neural-Network Feature Selector", Rudy Setiono, Huan Liu, IEEE Transactions on Neural Networks, vol. 8, No. 3, May 1997, pp. 654-662.*

(Continued)

*Primary Examiner* — Luis A Sitiriche
(74) *Attorney, Agent, or Firm* — Murphy, Bilak & Homiller, PLLC

(57) ABSTRACT

One or more failure regions are determined for an electrical device by training a machine learning classifier, including analyzing data points for the device and recognizing patterns in the data points. Each data point indicates pass or fail of the device for a particular combination of factors relating to the operation of the device. The trained machine learning classifier is used to predict the pass/fail state of new data points for the electrical device. Each new data point corresponds to a new combination of the factors relating to the operation of the device not previously analyzed by the machine learning classifier. A pass/fail border region can be identified for the electrical device based on the training of the machine learning classifier, the pass/fail border region excluding data points for which the electrical device is expected to pass or fail with a high degree of certainty.

20 Claims, 6 Drawing Sheets

(56) References Cited

OTHER PUBLICATIONS

"System reliability evaluation using Monte Carlo & support vector machine", Rocco et al, Annual Reliability and Maintainability Symposium, Jan. 27-30, 2003, pp. 482-486, 2003.*

Nirmaier, et al. "Fully automated semiconductor operating condition testing." International Test Conference, Paper 10.2. Qimonda, 2006. pp. 1-9.

Chang, et al. "LIBSVM: A Library for Support Vector Machines." National Taiwan University, 2001 (last updated Mar. 4, 2013) pp. 1-39.

"Discriminative Model", Wikipedia. Retrieved Sep. 10, 2014.

Foody, Giles, "The Significance of Border Training Patterns in Classification by a Feedforward Neural Network Using Back Propagation Learning", International Journal of Remote Sensing, vol. 20, No. 18, 1999, pp. 2549-3562.

Liu, et al., "Training Data Selection for Improving Discriminative Training of Acoustic Models", Graduate Institute of Computer Science & Information Engineering, National Taiwan Normal University, Taiwan, 2007, pp. 284-289.

Stopjakova, et al., "Neural Networks-Based Parametric Testing of Analog Ic", 17th IEEE International Symposium on Defect and Fault Tolerance in VLSI Systems (DFT 2002), 2002.

Tamilselvan, et al., "Failure Diagnosis using Deep Belief Learning based Health State Classification", Reliability Engineering and System Safety 115 (2013), pp. 124-135.

* cited by examiner

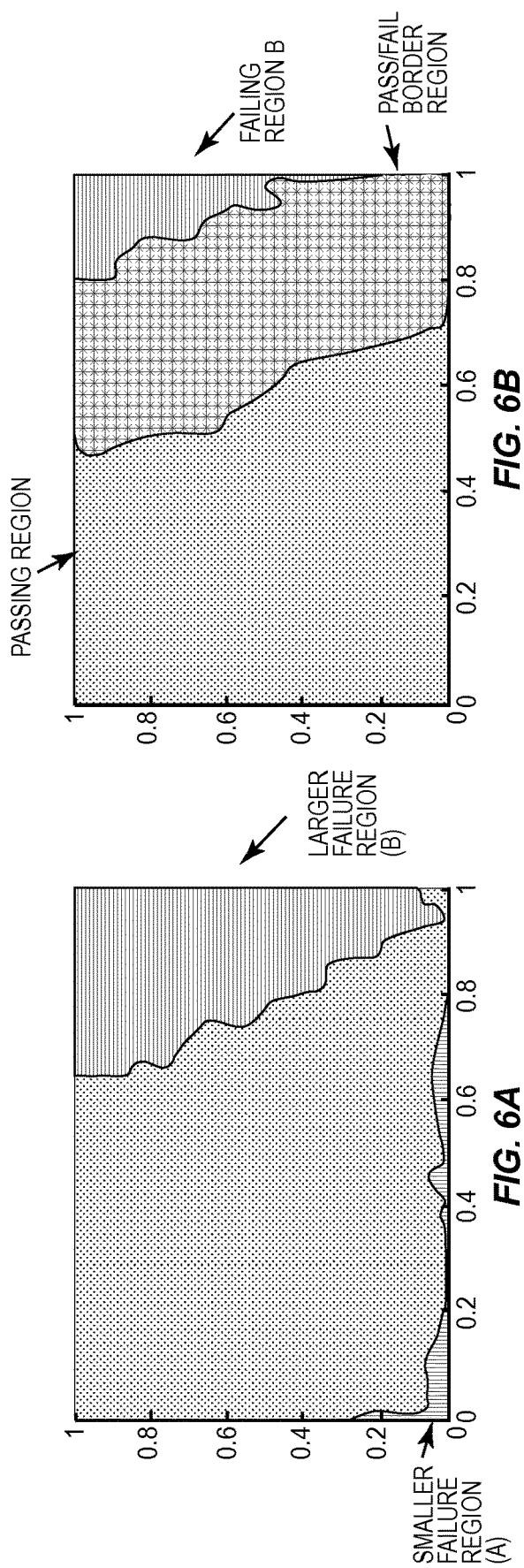
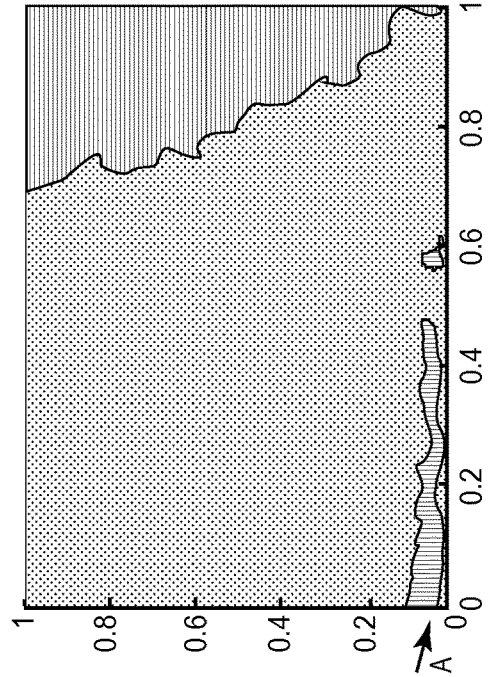
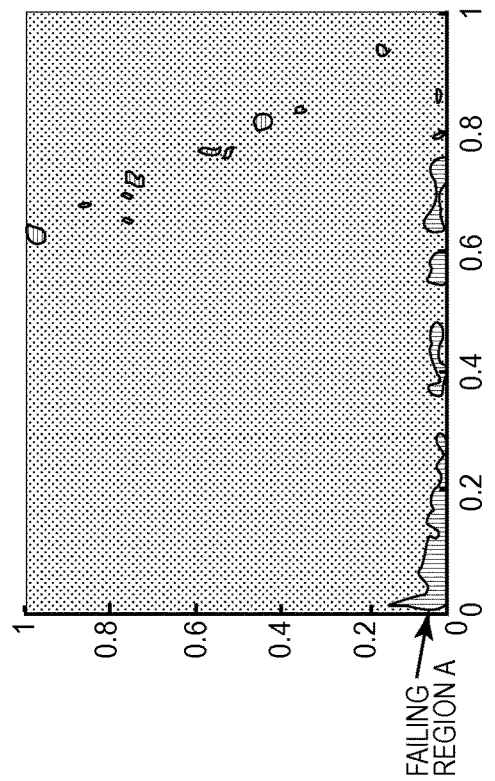
FIG. 6A
FIG. 6B
FIG. 6C
FIG. 6D

METHOD, APPARATUS AND COMPUTER PROGRAM PRODUCT FOR DETERMINING FAILURE REGIONS OF AN ELECTRICAL DEVICE

TECHNICAL FIELD

The present application relates to electrical devices, in particular accurately determining failure regions of an electrical device.

BACKGROUND

The performance of an electrical device depends on several influencing factors from electrical, mechanical and other physical domains, such as supply voltage, ambient temperature, amplifier gain, friction coefficients, threshold levels, load resistance, actuator inertia, etc. Some combinations of these factors result in the device passing a test or simulation, and other combinations that result in the device failing the test or simulation. In this parameter space, this leads to regions in which the test/simulation passes and other regions in which the test/simulation fails. When testing or verifying a device, it is beneficial to know the exact extent of those pass/fail regions and the border between such regions. However, it is not feasible to test all possible combinations of factors when there are many factors involved. Therefore, only a limited number of tests or simulations can be used to estimate the position of the pass/fail border region.

Conventional methods poorly make use of test or simulation data points to find the pass/fail border region. In simulation or with extensive hardware debugging, a failed test often can be traced back to a transient signal within the device that ultimately causes the test to fail when it crosses a threshold. The dependency of this continuous signal on various factors such as voltage, temperature, etc. can be analyzed with methods such as so-called 'design of experiments' or 'response surface methodology'. In turn, this shows how the failure depends on the factors under consideration. For the verification or production testing of chips, the chip performance is externally tested often only as a binary pass/fail signal. This limits the analysis options, as there is no information about the gradient or about how close a data point in the factor space is to the pass/fail border.

Several conventional approaches have been used for detecting the border between passing and failing regions of an electrical device. However, each of these approaches is only suitable for a low number of factors and/or has bad resolution. Furthermore, most approaches do not work well with diffuse or blurred pass/fail borders. For example, a 'sweep' approach performs a simple sweep of a single factor such as voltage or temperature. The device is tested with successively increasing values of the factor which are typically regularly spaced. The test results are then interpolated for the values between the sample points. Regions where neighboring data points have the same test result form pass or fail regions. The pass/fail border lies between those regions. Diffuse pass/fail borders may have values with different test results interspersed. The number of samples determines the resolution of this method. Testing more samples requires more time, but the value of the pass/fail border region can be detected more precisely.

A 'binary search' approach can be used to find the pass/fail border more quickly, and starts with a known passing setting (e.g. the nominal setting) and a known failing setting (e.g. the maximal or minimal setting). By definition, the pass/fail border lies between those values. In each iteration, the average of the passing and the failing setting is calculated and the device is tested with that setting. If the device passes the test, the old passing setting is replaced with the new setting. Similarly, the failing setting is replaced with the new setting if the device fails the test. As the interval between the passing and the failing setting is cut in half in each iteration, the two values converge towards the pass/fail border. If the border is diffuse, this method will choose one point on the diffuse border as the pass/fail border. Both the 'sweep' and 'binary search' approaches have the disadvantage that they only work with one factor, which is inadequate for most applications.

With a 'grid search' or so-called 'shmoo plot' approach, a grid search is performed on two or more factors. This involves a nested sweep. In the outer sweep, the first factor is swept. For each level of the first factor, a sweep of the second factor is performed. For each combination of the first two factors, the third factor is swept, and so on. This procedure samples every combination of the factor levels. However, the number of required samples increases exponentially with the number of dimensions. Therefore, only two or three factors can be varied with a reasonable resolution. To interpret the results, they can be displayed in a 'shmoo plot'. For two factors, the 'shmoo plot' shows the grid of the factor space where the color of each grid point signifies whether the test was successful or not. With more factors, the 'shmoo plot' displays a two-dimensional cross-section of the factor space. The other factors are either held at a certain value of the grid, or the color encodes the averaged failure rate over the remaining factors. In two dimensions, the pass/fail border can be sped up a bit if the first factor is swept as in the normal grid search, but a binary search is used for the second factor. However, this method does not scale well to more dimensions. The fast search can only be performed in one dimension and the other dimensions must be covered with a grid, which requires too many sample points. Additionally, with a diffuse border, the predicted pass/fail border is very erratic. The binary search merely picks one of the many values on the uncertain pass/fail border as the predicted border, so even for neighboring values of the first factor the values of the second factor may be scattered around.

With a 'Monte Carlo' approach, as with the grid search, several samples of factor settings are tested on the device. However the values of the factors do not come from a regular grid, but are chosen randomly. This frees the tester from the restriction that the grid resolution (and thus the number of samples) must be chosen in advance. Instead, the testing can be stopped at any time and can easily be augmented with additional samples. However, it is difficult to interpolate between the samples, as the samples are distributed irregularly. With the same number of samples, the resolution of the pass/fail border is even lower than with the grid search, as the random distribution adds noise. Most of the samples are not relevant in defining the pass/fail border region, giving little indication of the exact position of the pass/fail border. Furthermore, the results of a Monte Carlo test with multiple factors are more difficult to visualize in a 'shmoo plot'. While for two factors, the result of the Monte Carlo approach can be displayed with a scatter plot, multidimensional Monte Carlo results do not easily condense to a two-dimensional plot.

SUMMARY

According to an embodiment of a method of determining failure regions of an electrical device, the method comprises:

training a machine learning classifier by analyzing data points for the electrical device and recognizing patterns in the data points, each data point indicating pass or fail of the electrical device for a particular combination of factors relating to the operation of the electrical device; and using the trained machine learning classifier to predict the pass/fail state of new data points for the electrical device, each new data point corresponding to a new combination of the factors relating to the operation of the electrical device not previously analyzed by the machine learning classifier.

According to an embodiment of a computer system for determining failure regions of an electrical device, the computer system comprises memory and a processing circuit. The memory is configured to store data points for the electrical device, each data point indicating pass or fail of the electrical device for a particular combination of factors relating to the operation of the electrical device. The processing circuit is configured to train a machine learning classifier loaded into the memory by analyzing the data points and recognizing patterns in the data points, and predict the pass/fail state of new data points for the electrical device using the trained machine learning classifier. Each new data point corresponds to a new combination of the factors relating to the operation of the electrical device not previously analyzed by the machine learning classifier.

According to an embodiment, a non-transitory computer readable medium stores a computer program operable to determine failure regions of an electrical device. The computer program comprises program instructions to train a machine learning classifier by analyzing data points for the electrical device and recognizing patterns in the data points, each data point indicating pass or fail of the electrical device for a particular combination of factors relating to the operation of the electrical device. The computer program further comprises program instructions to predict the pass/fail state of new data points for the electrical device using the trained machine learning classifier, each new data point corresponding to a new combination of the factors relating to the operation of the electrical device not previously analyzed by the machine learning classifier.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 6, which includes FIGS. 6A through 6D, illustrates a succession of plot diagrams showing the results of a method for determining failure regions of an electrical device according to yet another embodiment.

DETAILED DESCRIPTION

The embodiments described herein train a classifier from the field of machine learning based on random sampling such as Monte Carlo sampling to improve the interpolation between test or simulation data points for an electrical device. The training of the classifier can be modified with adaptive sampling control to enhance the sampling procedure so that samples closer to the estimated pass/fail border region of the device are more likely to be selected for analysis by the classifier, further improving the accuracy of the pass/fail border region. The classifier can also be used to differentiate between different error conditions, so that multiple pass/fail border regions of the electrical device can be identified. Compared to conventional approaches, the embodiments described herein use fewer data points to achieve the same accuracy in identifying a pass/fail border region or the same number of data points to achieve better accuracy. The embodiments described herein scale well to a factor space of several dimensions and can handle diffuse pass/fail border regions. Failing and passing regions of any electrical device can be analyzed based on the embodiments described herein. For example, semiconductor chips, circuit boards, computer systems, mobile devices, hand-held devices, etc. can each be analyzed based on the embodiments described herein.

Figure 1:
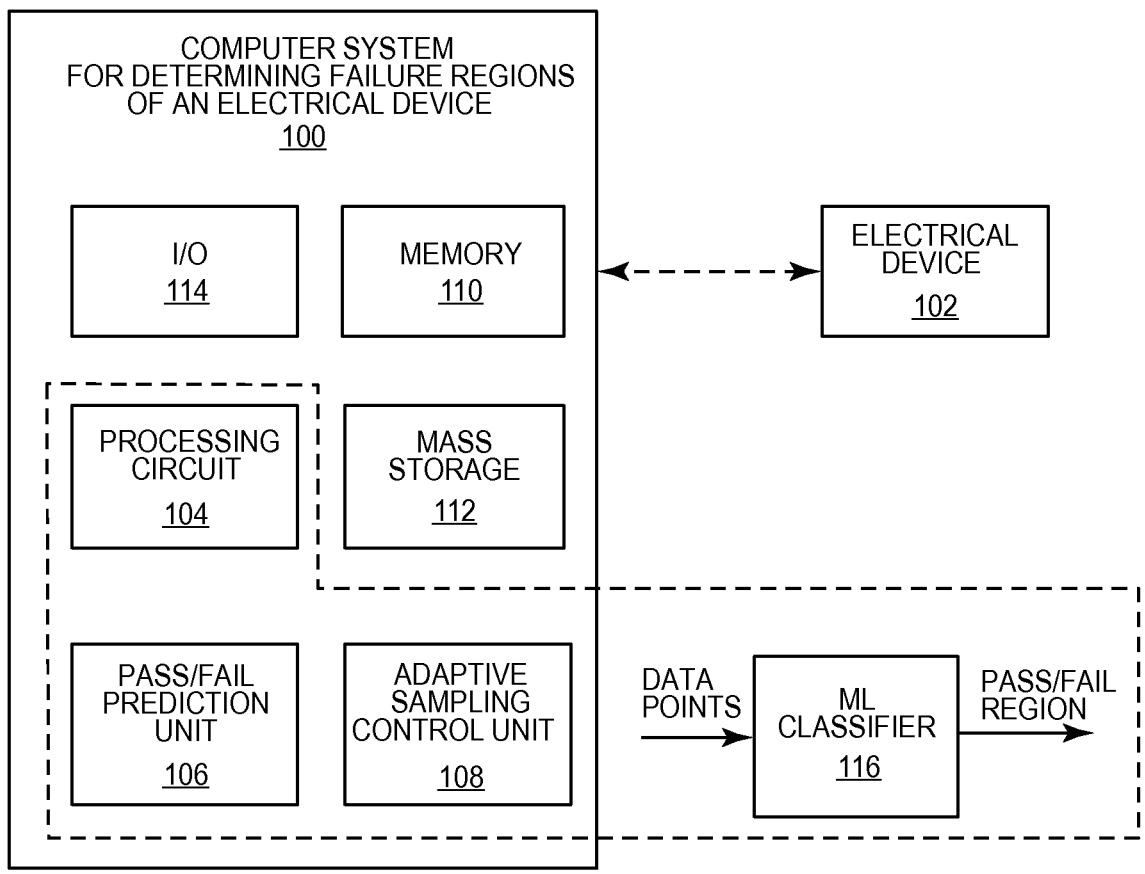
FIG. 1 illustrates a block diagram of an embodiment of a computer system for determining failure regions of an electrical device.

FIG. 1 illustrates a block diagram of an embodiment of a computer system 100 for determining failure regions of an electrical device 102. The computer system 100 includes a processing circuit 104 which can include digital and/or analog circuitry such as one or more controllers, processors, ASICs (application-specific integrated circuits), etc. for executing program code which performs the failure region analyses described herein. To this end, the computer system 100 also includes a pass/fail prediction unit 106 and an adaptive sampling control unit 108 included in or associated with the processing circuit 104. The computer system 100 also has non-transitory computer readable medium such as memory 110 like DRAM (dynamic random access memory) and mass storage 112 like an HDD (hard disk drive), optical disk drive, etc. for storing the program code and related data processed and accessed by the processing circuit 104, pass/fail prediction unit 106, and adaptive sampling control unit 108 during execution of program code. The computer system 100 further has I/O (input/output) circuitry 114 for sending and receiving information, including receiving test and/or simulation data points for the electrical device 102 under consideration. The I/O circuitry 114 can directly or indirectly receive the data points from the electrical device 102 as indicated by the dashed line in FIG. 1.

Figure 2:
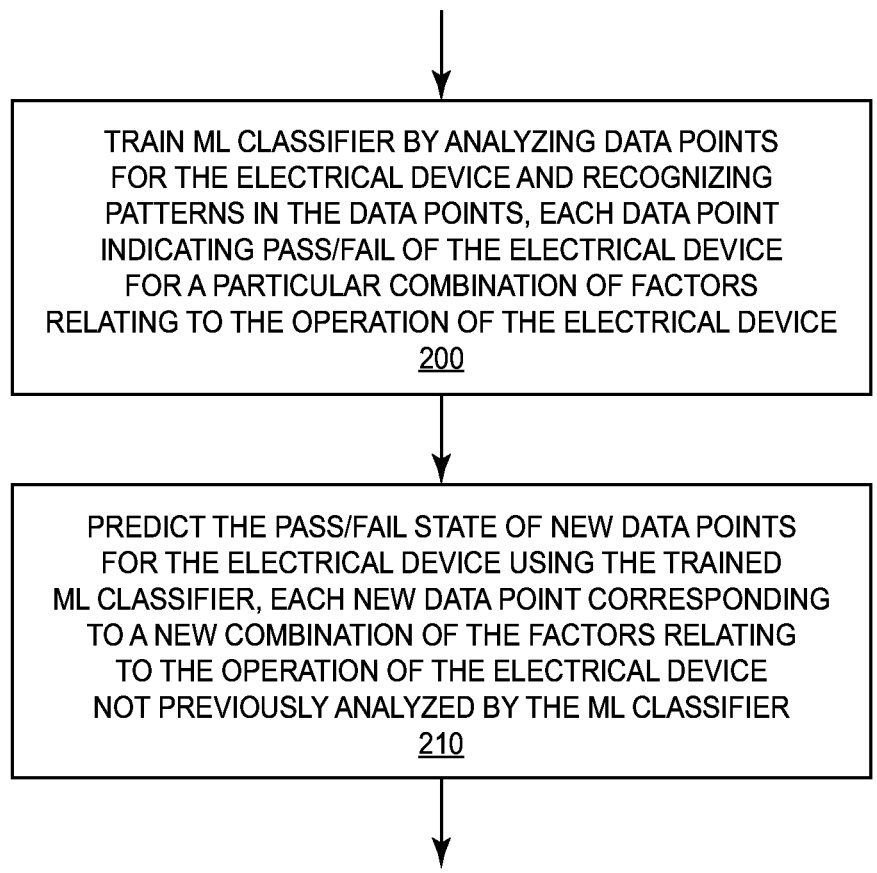
FIG. 2 illustrates a block diagram of an embodiment of a method for determining failure regions of an electrical device.

FIG. 2 illustrates an embodiment of a method of determining failure regions of the electrical device 102, as implemented by the computer system 100 of FIG. 1. The program code associated with the method is stored in the mass storage 112 of the computer system 100 and loaded into the memory 110 for execution by the processing circuit 104. The memory 110 also stores data points for the electrical device 102 that are analyzed by the processing circuit 104. Each data point indicates pass or fail of the electrical device 102 for a particular combination of factors relating to the operation of the device 102 such as supply voltage, ambient temperature, amplifier gain, friction coefficients, threshold levels, load resistance, actuator inertia, etc. The data points can be actual test data points obtained by hardware testing of the electrical device 102, or simulation data points obtained by simulating or verifying the design of the device 102. In either case, each data point indicates whether the electrical device 102 passes or fails a certain hardware test or simulation/verification test for a particular combination of factors relating to the operation of the device 102.

The method includes training a machine learning (ML) classifier 116 implemented by the processing circuit 104, by analyzing some or all of the data points stored in the memory 110 for the electrical device 102 and recognizing patterns in the data points (200). The training of the ML classifier 116 can be done by the processing circuit 104, with support from the pass/fail prediction unit 106 and the adaptive sampling control unit 108 as indicated by the dashed box in FIG. 1. The ML classifier 116 can be a neural network, support vector machine, decision tree or random forest, deep believe networks, 'AdaBoost' or other boosting method, genetic programming, Bayesian Network, or any other type of ML classifier well-suited for analyzing test/simulation data and recognizing patterns in such data. Such ML classifiers can be readily modified, enhanced and/or combined by those skilled in the art, and therefore no further explanation is given in this regard.

In general, classification is a concept from the computer science discipline of machine learning. The ML classifier 116 implemented by the processing circuit 104 learns a set of data points (i.e. factor levels and the corresponding pass/fail label) for the electrical device 102 under consideration, which can be obtained by random sampling. In one embodiment, the data points are obtained by Monte Carlo sampling. After training of the ML classifier 116 based on the selected data points, the ML classifier 116 in conjunction with the pass/fail prediction unit 106 can predict the pass/fail label of new data points not previously considered. For hardware testing, this means that based on the test results of several configurations of factors, the ML classifier 116 in conjunction with the pass/fail prediction unit 106 can predict whether the electrical device 102 will pass the test for other, untested configurations. As the evaluation of the ML classifier 116 is significantly faster than actual testing of the electrical device 102, orders of magnitude more data points can be analyzed by the ML classifier 116 than could be practically tested or simulated. As such it is feasible for example to perform a grid search with fine resolution on the ML classifier 116, which yields a good estimate of the passing and failing regions of the electrical device 102 as well as of the border between the passing and failing regions.

The accuracy of the pass/fail predictions increases with the number of analyzed data points. However, classification algorithms are typically designed to yield high prediction accuracy even with few data points. Therefore, compared to conventional failure region analysis methods, ML classifiers need far fewer data points to achieve the same accuracy. Many classification algorithms are also well suited for multidimensional factor spaces, where conventional failure region analysis methods require too many data points to yield good resolution. Furthermore, robust ML classifiers e.g. of the kind identified above can handle outliers. In the context of device testing, this means that the ML classifier 116 is not completely confused by a clearly faulty measurement e.g. due to a power surge in the lab equipment. In addition, robust ML classifiers can handle diffuse pass/fail border regions, because even then the classifier finds the pass/fail border region that best separates the passing and failing regions of the electrical device 102 under consideration.

Continuing with the method of FIG. 2, the pass/fail prediction unit 106 uses the trained ML classifier 116 to predict the pass/fail state of new data points for the electrical device 102 under consideration (210). Each new data point corresponds to a new combination of the factors relating to the operation of the electrical device 102 not previously analyzed by the ML classifier 116. As such, the pass/fail prediction unit 106 interpolates between actual test or simulation data points for the electrical device 102 with the aid of the trained ML classifier 116. In one embodiment, the pass/fail prediction unit 106 identifies a pass/fail border region for the electrical device 102 based on the trained ML classifier 116. The pass/fail border region corresponds to an operating region of the electrical device 102 in which the probability of the device 102 failing is significantly greater than 0% and significantly less than 100% e.g. about 50%. The pass/fail border region excludes data points for which the electrical device 102 is expected to pass or fail with a high degree of certainty e.g. 70% or above certainty. In the case of simulation data points forming the basis for the method of determining failure regions, the design of the electrical device 102 can be evaluated and modified if needed based on the pass/fail border region determined by the pass/fail prediction unit 102. In the case of hardware test data points forming the basis for the method of determining failure regions, production testing of devices having the same design as the analyzed electrical device 102 can be performed based on the pass/fail border region. Also, the information provided by the pass/fail prediction unit 102 can be used for failure rate analysis e.g. by combining the probability of device failure for a data point with the probability of that data point actually occurring. This allows the calculation of the failure probability in practical terms. In yet another use case, the information provided by the pass/fail prediction unit 102 can be used to sort electrical devices into different quality 'bins' or groups. For example a device may not be acceptable for stringent applications such as a military-grade specification, but may be expected to function properly in less stringent applications such as consumer electronics.

Figure 3:
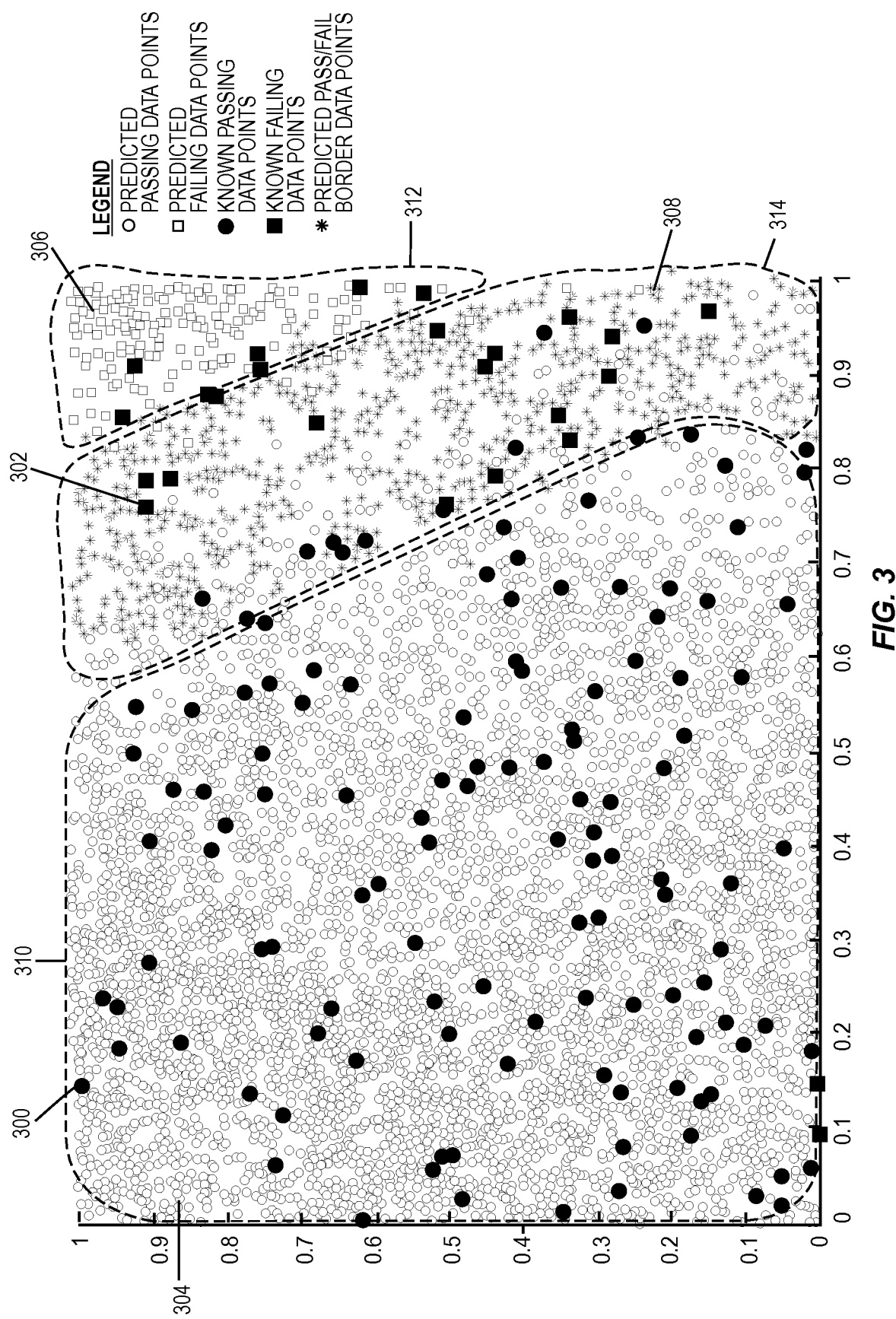
FIG. 3 illustrates a plot diagram showing the results of the method of FIG. 2.

FIG. 3 illustrates a plot diagram illustrating data points 300, 302 for an electrical device 102 analyzed by the ML classifier 116 to predict new pass/fail data points 304, 306, 308. The position of each data point is determined by the value of its first factor for the horizontal axis and of the second factor for the vertical axis. In FIG. 3, the two factors under consideration (plotted via the x and y axis) range from 0 to 1. The data points 300, 302 analyzed by the ML classifier are larger and have dark shading in FIG. 3, and represent pass (300) or fail (302) test data for a high-power semiconductor chip. The new pass/fail data points 304, 306, 308 predicted by the ML classifier 116 after training based on the original data points 300, 302 are smaller and have no shading in FIG. 3 and represent likely passing (304), likely failing (306) or possibly passing or failing (308) data points. The new pass/fail data points 304 that are clearly passing define a passing region 310 for the electrical device 102 in which the passing state of the device 102 is relatively certain for particular combinations of factors. Similarly the new pass/fail data points 306 that are clearly failing define a failure region 312 for the electrical device 102 in which the failing state of the device 102 is relatively certain for other combinations of factors. The new pass/fail data points 308 that are possibly passing or failing define a pass/fail border region 314 for the electrical device 102 in which the passing or failing state of the device 102 is uncertain for yet other combinations of factors.

In this purely illustrative example, six factors were analyzed that influence the behavior of the electrical device 102 and relate to the voltages and timing of the surrounding environment. Due to the experimental conditions and random influences, for some configurations the electrical device 102 may pass the test sometimes and fail the test other times. As such, the pass/fail border region 314 for the electrical device 102 is not clear-cut as shown in FIG. 3. Instead, there is a region 314 where the probability of failure or passing is uncertain.

With six factors considered, a full grid search with just three levels per factor would require more than 700 data points which is infeasible for many applications. Instead, the electrical device 102 was tested at 150 data points selected with Monte Carlo sampling. In a long test run, several thousand further data points were tested to verify the performance of the classifier-based method of FIG. 2. The test results predicted by the classifier-based method of FIG. 2 were compared to the actual results, and the average accuracy of the method of FIG. 2 is used to quantify its performance.

Two factors have significantly more influence than the other factors on whether the electrical device 102 passes the test. The plot of FIG. 3 shows the distribution of the data points 300, 302 along these two dimensions. Although only two of the six factors proved to be significant in this example, the embodiments described herein provide robust performance results if more factors are influential. The example with two factors was chosen to simplify the visualization. It can be seen in FIG. 3 that the failing region 312 is in the top right corner. Furthermore, the failing region 312 and the passing region 310 can overlap. This can be due to the diffuse pass/fail border region 314 or because the border 314 also depends on a third factor that is not displayed in this plot. As such, three regions 310, 312, 314 are identified in FIG. 3: a falling region 312 where all or almost all data points 300, 302 strongly indicate failure of the device 102; a passing region 310 where all or almost all data points 300, 302 strongly indicate passing of the device 102; and a pass/fail border region 314 where some data points 302 indicate failure of the device 102 and other data points 300 indicate passing of the device 102. Also there are two failing data points 302 in the lower left corner of the plot, far away from the large failing region 312 in the upper right-hand corner of the plot. These failing data points 302 can correspond to measurement errors or actual failures due to another (non-dominant) failure mode.

The ML classifier 116 used in this case is a 'support vector machine' algorithm in the form of a free library called 'libsvm' which is described in a paper authored by Chih-Chung Chang and Chih-Jen Lin entitled "LIBSVM: a library for support vector machines", published by ACM Transactions on Intelligent Systems and Technology, 2:27:1-27:27, 2011, the content of said paper incorporated by reference in its entirety. The corresponding software is available at http://www.csie.ntu.edu.tw/~cjlin/libsvm". This library has been applied for tasks such as processing neuroscientific data or for classifying proteins. Using Monte Carlo sampling to select the data points 300, 302, the SVM classifier 316 yields an accuracy of 88.9%. Additionally, the SVM classifier 316 also gives a failure probability instead of just a binary pass/fail signal. The prediction also defines relatively certain passing and failing regions 310, 312, with a pass/fail border region 314 in between. At least some of the data points 300, 302 analyzed by the ML classifier 316 need not necessarily be selected randomly, but instead may be selected adaptively to further improve the accuracy of the process.

Figure 4:
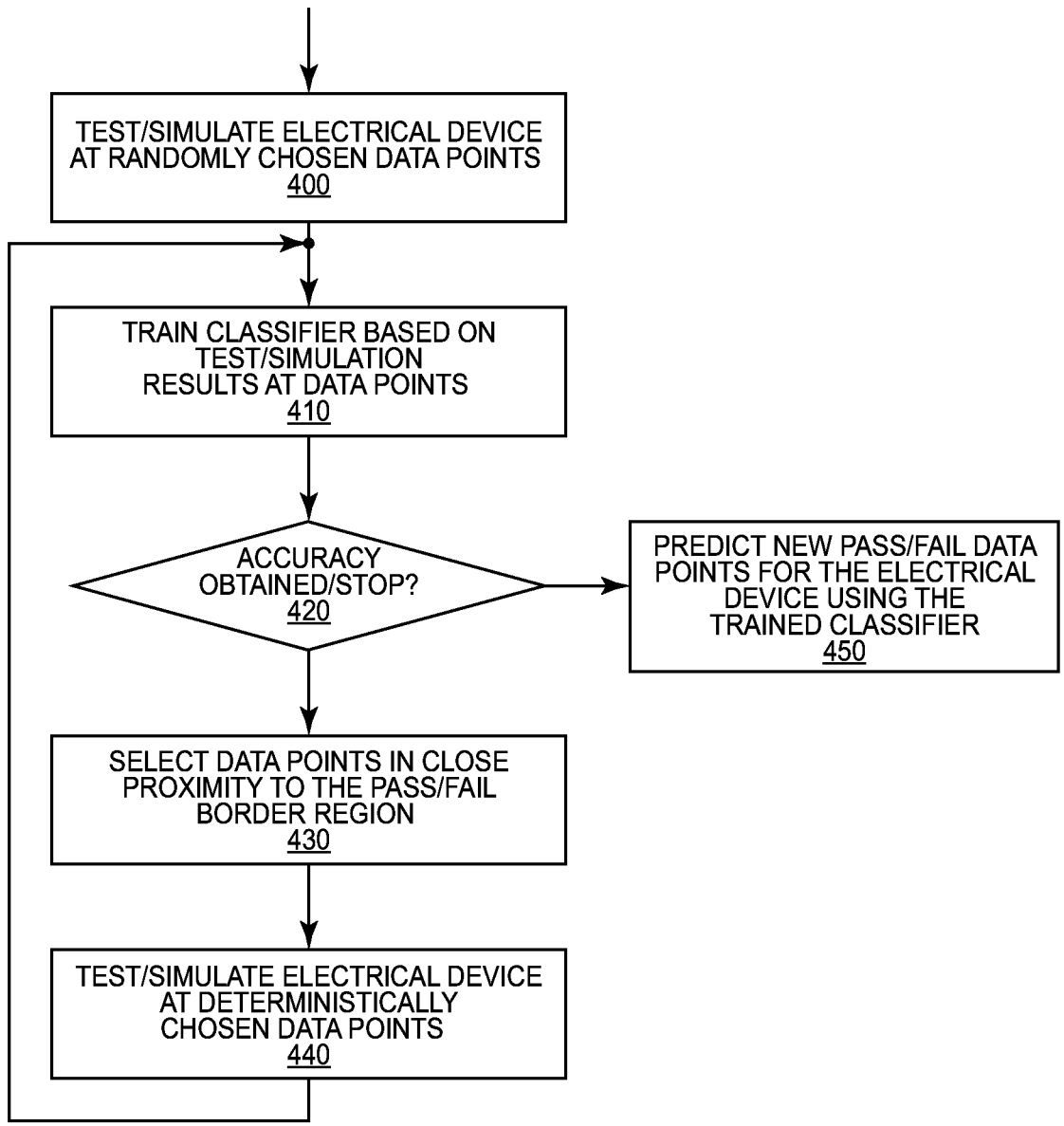
FIG. 4 illustrates a block diagram of another embodiment of a method for determining failure regions of an electrical device.

FIG. 4 illustrates an embodiment of a method of determining failure regions of an electrical device 102, as implemented by the computer system 100 of FIG. 1, in which some of the data points analyzed by the ML classifier 116 are adaptively selected. According to this embodiment, the electrical device 102 under consideration is initially tested or simulated at randomly chosen points e.g. based on Monte Carlo sampling (400). The ML classifier 116 is then trained by analyzing the randomly selected data points to roughly estimate a pass/fail border region of the electrical device (410). These steps correspond to the method of FIG. 2.

If the desired accuracy of the pass/fail border region is not achieved and no stopping criterion (e.g. number of iterations and/or % improvement each iteration) are met (420), the ML classifier 116 adaptively selects data points in close proximity to the roughly estimated pass/fail border region (430) e.g. using weighted Monte Carlo sampling and the electrical device 102 is again tested or simulated under the corresponding combinations of factors represented by the adaptively selected data points (440). The ML classifier 116 is re-trained on the adaptively selected data points to improve the accuracy of the pass/fail border region (410). In one embodiment, the adaptively selected data points have a pass/fail probability of about 50%. The process of adaptively selecting data points which are in close proximity to the pass/fail border region and re-training the machine learning classifier based on the adaptively selected data points to further refine the pass/fail border region can be repeated any desired number of times, e.g. until the desired accuracy is achieved or one or more stopping criterion are met. After the desired accuracy is achieved or a stopping criteria is met, the pass/fail prediction unit 106 of the computer system 100 uses the trained ML classifier 116 to predict new pass/fail data points for the electrical device 102 as previously described herein (450).

Figure 5:
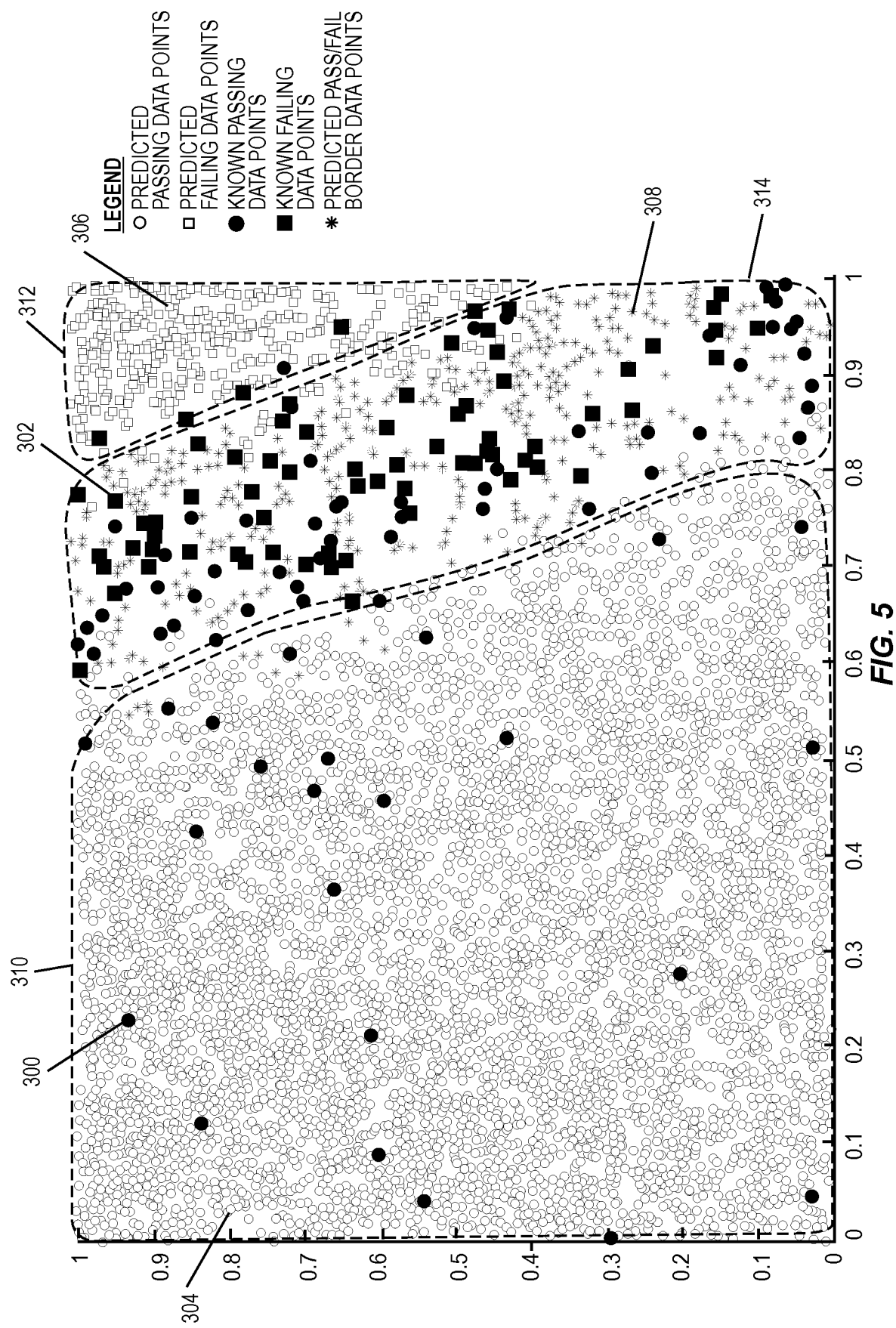
FIG. 5 illustrates a plot diagram showing the results of the method of FIG. 4.

FIG. 5 illustrates a plot diagram illustrating data points 300, 302 for an electrical device 102 analyzed according to the method of FIG. 4. FIG. 5 is similar to FIG. 3, however, most of the data points 300, 302 analyzed by the ML classifier 116 were adaptively selected to be in close proximity to the pass/fail border region 314. Re-training the ML classifier 116 on data points 300, 302 in close proximity to the pass/fail border region 314 instead of using all randomly selected data points improves the accuracy of the predicted pass/fail border region 314 to 92.0% for the same sample size of 150 data points in this example. Most data points 300, 302 analyzed by the ML classifier 116 are concentrated in the pass/fail border region 314, while only a few data points 300, 302 from the known passing and failing regions 310, 312 are analyzed by the ML classifier 116. Increasing the sample size will not increase the accuracy much further in this example, as the test results around the diffuse pass/fail border region 314 are random and thus cannot be predicted with 100% accuracy.

In some cases, the electrical device 102 under consideration can have more than one failure region. For example, the device 102 may have one dominant failure region as shown in the top right hand corner of FIGS. 3 and 5 and one or more smaller regions. The classification embodiments described previously herein can be modified so that the smaller failure regions can be detected and predicted.

FIG. 6, which includes FIGS. 6A through 6D, illustrates an embodiment of modifying the classification embodiments described to detect a smaller failure region of an electrical device 102. In this example, the second failure region along the bottom of the x-axis in FIG. 6A is significantly smaller than the dominant failure region in the top right corner of FIG. 6A. A first pass of the classification process described previously herein ignores the data points in the smaller failure region as 'passing' outliers as shown in FIG. 6B. However, after the first (larger) failure region is detected, the data points included in the large failure region and the adjacent pass/fail border region can be masked as passing data points as shown in FIG. 6C. The ML classifier 116 is then re-trained after the failing data points are masked as passing data points. Doing so enables the ML classifier 116 to identify the second (smaller) failure region and any corresponding pass/fail border region along the bottom of the x-axis. The composite result is shown in FIG. 6D. This process can be used again to further investigate yet another failure mechanism (and thus a new failure region), without interference from the other failure modes, by repeating the masking and classifier re-training processes. In one embodiment, a multi-class SVM classifier is used afterward to distinguish between the passing region and the different failure regions.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of determining failure regions of an electrical device, the method comprising:
   training a machine learning classifier by analyzing data points for the electrical device and recognizing patterns in the data points, each data point indicating pass or fail of the electrical device for a particular combination of factors relating to the operation of the electrical device; and
   using the trained machine learning classifier to predict the pass/fail state of new data points for the electrical device, each new data point corresponding to a new combination of the factors relating to the operation of the electrical device not previously analyzed by the machine learning classifier.

2. The method of claim 1, further comprising identifying a pass/fail border region for the electrical device based on the training of the machine learning classifier, the pass/fail border region excluding data points for which the electrical device is expected to pass or fail with a high degree of certainty.

3. The method of claim 2, wherein identifying the pass/fail border region comprises:
   initially training the machine learning classifier based on randomly selected data points to roughly estimate the pass/fail border region;
   adaptively selecting data points which are in close proximity to the roughly estimated pass/fail border region; and
   re-training the machine learning classifier based on the adaptively selected data points to refine the pass/fail border region.

4. The method of claim 3, wherein the adaptively selected data points have a pass/fail probability of about 50%.

5. The method of claim 3, further comprising repeating the process of adaptively selecting data points which are in close proximity to the pass/fail border region and re-training the machine learning classifier based on the adaptively selected data points to further refine the pass/fail border region.

6. The method of claim 2, further comprising evaluating the design of the electrical device based on the pass/fail border region.

7. The method of claim 2, further comprising testing a plurality of devices having the same design as the electrical device based on the pass/fail border region.

8. The method of claim 1, further comprising:
   re-training the machine learning classifier with the failing data points masked as passing data points; and
   using the re-trained machine learning classifier to identify another pass/fail border region for the electrical device.

9. The method of claim 8, repeating the re-training of the machine learning classifier at least one additional time with the failing data points masked as passing data points, to identify at least one additional new pass/fail border region for the electrical device.

10. The method of claim 1, wherein the machine learning classifier is a support vector machine, a neural network, a deep believe network or a random forest.

11. The method of claim 1, further comprising selecting the data points for training the machine learning classifier using Monte Carlo sampling.

12. The method of claim 1, wherein each data point used to train the machine learning classifier is a test data point for the electrical device or a simulation data point for the electrical device.

13. A computer system for determining failure regions of an electrical device, comprising:
   a memory configured to store data points for the electrical device, each data point indicating pass or fail of the electrical device for a particular combination of factors relating to the operation of the electrical device; and
   a processing circuit configured to train a machine learning classifier loaded into the memory by analyzing the data points and recognizing patterns in the data points, and predict the pass/fail state of new data points for the electrical device using the trained machine learning classifier, each new data point corresponding to a new combination of the factors relating to the operation of the electrical device not previously analyzed by the machine learning classifier.

14. The computer system of claim 13, wherein the processing circuit is further configured to identify a pass/fail border region for the electrical device based on the training of the machine learning classifier, the pass/fail border region excluding data points for which the electrical device is expected to pass or fail with a high degree of certainty.

15. The computer system of claim 14, wherein the processing circuit is configured to initially train the machine learning classifier based on randomly selected data points to roughly estimate the pass/fail border region, adaptively select data points which are in close proximity to the roughly estimated pass/fail border region, and re-train the machine learning classifier based on the adaptively selected data points to refine the pass/fail border region.

16. The computer system of claim 15, wherein the processing circuit is configured to repeat the process of adaptively selecting data points which are in close proximity to the pass/fail border region and re-training the machine learning classifier based on the adaptively selected data points to further refine the pass/fail border region.

17. The computer system of claim 13, wherein the processing circuit is further configured to re-train the machine learning classifier with the failing data points masked as passing data points, and use the re-trained machine learning classifier to identify another pass/fail border region for the electrical device.

18. The computer system of claim 17, wherein the processing circuit is configured to repeat the re-training of the machine learning classifier at least one additional time with the failing data points masked as passing data points, to identify at least one additional new pass/fail border region for the electrical device.

19. The computer system of claim 13, wherein the processing circuit is configured to select the data points for training the machine learning classifier using Monte Carlo sampling.

20. A non-transitory computer readable medium storing a computer program operable to determine failure regions of an electrical device, the computer program comprising:
  program instructions to train a machine learning classifier by analyzing data points for the electrical device and recognizing patterns in the data points, each data point indicating pass or fail of the electrical device for a particular combination of factors relating to the operation of the electrical device; and
  program instructions to predict the pass/fail state of new data points for the electrical device using the trained machine learning classifier, each new data point corresponding to a new combination of the factors relating to the operation of the electrical device not previously analyzed by the machine learning classifier.

\* \* \* \* \*